(12) United States Patent
Lee

(10) Patent No.: US 7,459,394 B2
(45) Date of Patent: Dec. 2, 2008

(54) METHODS OF MANUFACTURING SEMICONDUCTOR DEVICES

(75) Inventor: Ki Min Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 389 days.

(21) Appl. No.: 11/324,760

(22) Filed: Jan. 3, 2006

(65) Prior Publication Data

US 2006/0172528 A1 Aug. 3, 2006

Related U.S. Application Data

(63) Continuation of application No. 10/744,717, filed on Dec. 23, 2003, now abandoned.

(30) Foreign Application Priority Data

Dec. 30, 2002 (KR) .................. 10-2002-0087370

(51) Int. Cl.
*H01L 21/44* (2006.01)

(52) U.S. Cl. .............. 438/672; 438/653; 438/643; 438/645; 257/E21.002

(58) Field of Classification Search .............. 438/672, 438/653, 643, 645
See application file for complete search history.

(56) References Cited

U.S. PATENT DOCUMENTS

| | | | | |
|---|---|---|---|---|
| 6,251,786 B1 * | 6/2001 | Zhou et al. | .................. | 438/692 |
| 6,537,913 B2 * | 3/2003 | Modak | .................. | 438/687 |
| 6,670,274 B1 * | 12/2003 | Liu et al. | .................. | 438/692 |
| 6,730,594 B2 * | 5/2004 | Noguchi et al. | ............. | 438/653 |

* cited by examiner

*Primary Examiner*—Zandra Smith
*Assistant Examiner*—Christy L Novacek
(74) *Attorney, Agent, or Firm*—Saliwanchik, Lloyd & Saliwanchik

(57) ABSTRACT

Methods of manufacturing semiconductors are disclosed. One example method includes forming a trench through a dual damascene process, depositing a barrier metal layer on the overall surface, and depositing copper in the trench to form a copper line. The example method may also include performing a wet etching process to remove the top portion of the copper line, depositing a barrier layer on the etched copper line, and performing a planarization process to flatten the barrier layer.

6 Claims, 2 Drawing Sheets

METHODS OF MANUFACTURING SEMICONDUCTOR DEVICES

RELATED APPLICATION

This patent arises from a continuation of U.S. application Ser. No. 10/744,717, which was filed on Dec. 23, 2003 now abandoned.

TECHNICAL FIELD

The present disclosure relates to semiconductor devices and, more particularly, to a methods of manufacturing semiconductor devices.

BACKGROUND

Generally, in a copper damascene process, a trench is formed in a substrate and a barrier metal layer is deposited on the overall surface of the substrate and the trench. Then, a copper layer is deposited over the barrier metal layer so that the trench is completely filled. A chemical mechanical polishing process is performed to flatten the copper layer. As a result, a copper interconnect is formed. Next, a barrier layer is formed over the copper interconnect.

However, most barrier layers used as an etch-stop layer in a damascene process have high capacitance, thereby increasing the delay time of electrons. Such increase in the delay time of electrons makes it difficult to enhance processing speed of the device.

DETAILED DESCRIPTION

Disclosed herein is an example semiconductor device manufacturing process that reduces capacitance of an interlayer dielectric (ILD), thereby reducing delay time of electrons by forming a barrier layer only on a copper line, and, therefore, can enhance processing speed of a device produced by a copper damascene process.

Figure 1A:
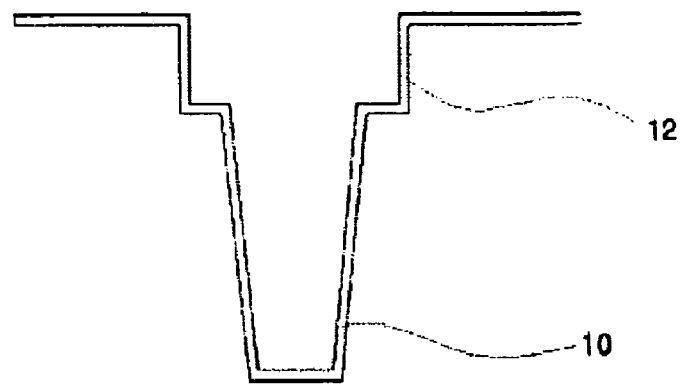
FIGS. 1a through 1f illustrate, in cross-sectional views, the results of process steps for fabricating a semiconductor device.

Referring to FIG. 1a, a trench 10 of a dual damascene structure is formed in an interlayer dielectric (ILD) through a predetermined patterning process so that a portion of a lower metal interconnect is exposed. Then, a barrier metal layer 12 to prevent diffusion of copper is deposited on the surface of the ILD including the trench 10.

Figure 1B:
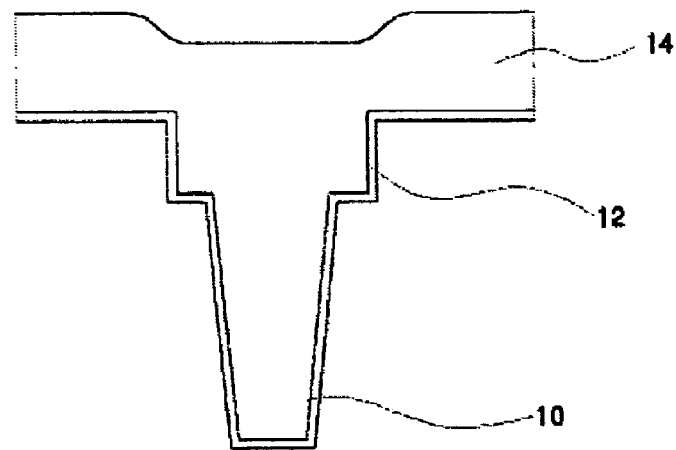
Figure 1C:
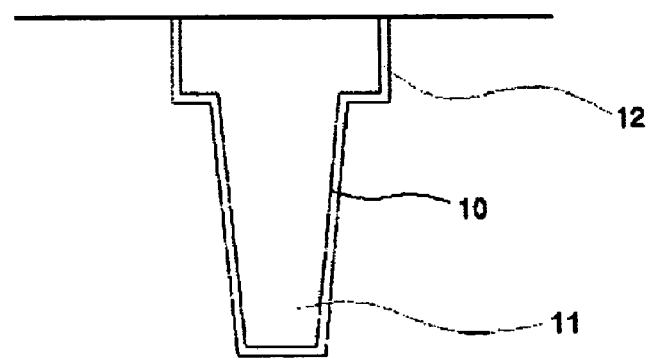

Referring to FIG. 1b, a copper layer 14 is deposited so that the trench 10 is completely filled with copper. The copper is deposited by means of at least one of electroplating and chemical vapor deposition (CVD). Referring to FIG. 1c, a planarization process is performed to flatten the copper layer. The planarization process may be, for example, a chemical mechanical polishing (CMP) process or an etch back process. As a result, a copper line 11 is formed.

Figure 1D:
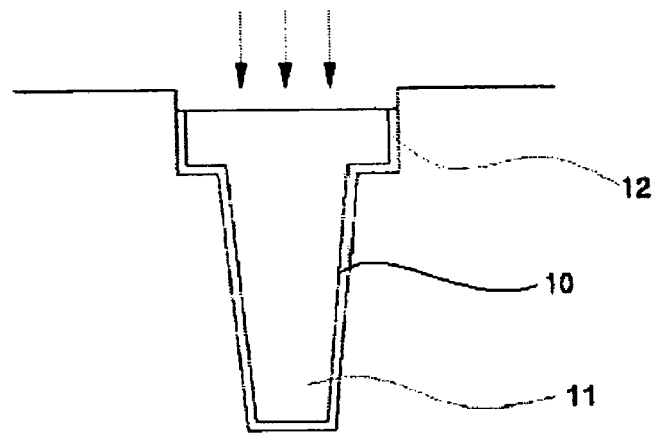

Referring to FIG. 1d, an etching process such as wet etching is performed to remove some part of the copper line 11 in the trench 10. In one example, the etching may be wet etching performed using an etching solution such as hydrochloric acid, dilute sulfuric acid, or aqueous ammonia, which have relatively low etching speeds.

Figure 1E:
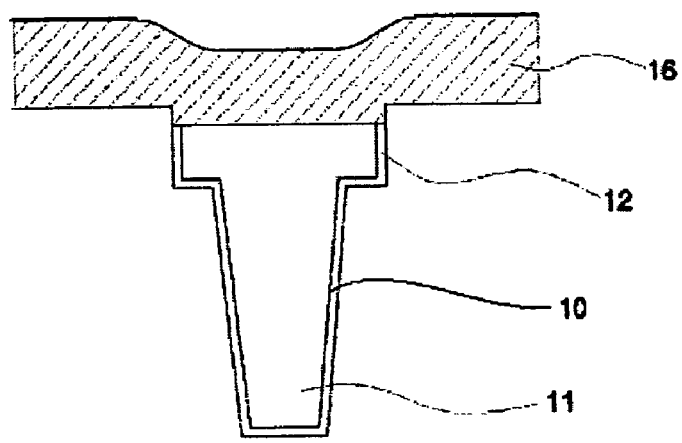
Figure 1F:
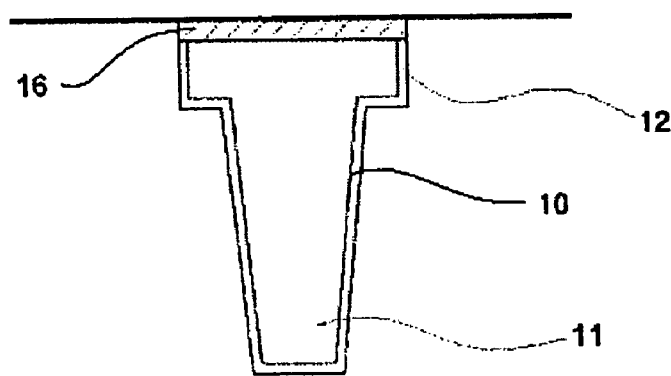

Referring to FIG. 1e, a barrier layer 16 is deposited on the etched copper line 11. The barrier layer may be formed of SiN or SiC. Referring to FIG. 1f, a planarization process is performed to flatten the barrier layer. The planarization process may employ CMP or an etch back process.

The foregoing describes how a barrier layer is formed only on the copper line using SiN or SiC to reduce capacitance of the ILD, thereby reducing delay time of electrons, which is proportional to resistance-capacitance (RC). Therefore, the disclosed techniques can increase processing speed of device.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for manufacturing a semiconductor device comprising:
    forming a trench in an interlayer dielectric through a dual damascene process;
    depositing a barrier metal layer directly on an overall surface of the interlayer dielectric and the trench, the barrier metal layer preventing diffusion of copper;
    depositing a copper layer in the trench;
    planarizing the copper layer to form a copper line, wherein the barrier metal layer on the interlayer dielectric is removed;
    performing a wet etching process to remove a top portion of the copper line, wherein the barrier metal layer within an upper portion of the trench is removed;
    depositing a dielectric barrier layer on the etched copper line; and
    performing a planarization process to flatten the dielectric barrier layer such that the top surface of the dielectric barrier layer is formed on a same horizontal plane with the top surface of the interlayer dielectric,
    wherein the lower surface of the dielectric barrier layer is formed directly on the copper line and the barrier metal layer, and
    wherein the side surface of the dielectric barrier layer directly contacts the interlayer dielectric.

2. A method as defined by claim 1, wherein the dielectric barrier layer is formed of SiN or SiC.

3. A method as defined by claim 1, wherein the copper is deposited by at least one of electroplating and chemical vapor deposition (CVD).

4. A method as defined by claim 1, wherein the wet etching is performed using hydrochloric acid, dilute sulfuric acid, or aqueous ammonia.

5. A method as defined by claim 1, wherein the planarization process comprises chemical mechanical polishing.

6. A method as defined by claim 1, wherein the planarization process comprises an etch back process.

* * * * *